(12) United States Patent
Cox et al.

(10) Patent No.: US 11,994,547 B2
(45) Date of Patent: May 28, 2024

(54) EXTENDED PULSE SAMPLING SYSTEM AND METHOD

(71) Applicant: Photonic Systems, Inc., Billerica, MA (US)

(72) Inventors: Charles H. Cox, Carlisle, MA (US); Thomas Warner, Bedford, MA (US)

(73) Assignee: PHOTONIC SYSTEMS, INC., Billerica, MA (US)

( * ) Notice: Subject to any disclaimer, the term of this patent is extended or adjusted under 35 U.S.C. 154(b) by 0 days.

(21) Appl. No.: 17/766,248

(22) PCT Filed: Oct. 13, 2020

(86) PCT No.: PCT/US2020/055335
§ 371 (c)(1),
(2) Date: Apr. 3, 2022

(87) PCT Pub. No.: WO2021/076479
PCT Pub. Date: Apr. 22, 2021

(65) Prior Publication Data
US 2024/0053393 A1    Feb. 15, 2024

Related U.S. Application Data

(60) Provisional application No. 62/915,593, filed on Oct. 15, 2019.

(51) Int. Cl.
*H03M 1/00* (2006.01)
*G01R 29/02* (2006.01)
*H03M 3/00* (2006.01)

(52) U.S. Cl.
CPC ............ *G01R 29/02* (2013.01); *H03M 3/344* (2013.01); *H03M 3/402* (2013.01)

(58) Field of Classification Search
CPC .............................. H03M 3/402; H03M 3/344
USPC .................................................. 341/122, 157
See application file for complete search history.

(56) References Cited

U.S. PATENT DOCUMENTS

| | | | |
|---|---|---|---|
| 9,172,416 B2 * | 10/2015 | Suominen | .............. H03D 3/009 |
| 10,514,588 B2 | 12/2019 | Betts et al. | |
| 2003/0016347 A1 | 1/2003 | Ohta | |
| 2003/0034446 A1 | 2/2003 | Watanabe | |

(Continued)

FOREIGN PATENT DOCUMENTS

| | | |
|---|---|---|
| EP | 4 046 246 A1 | 8/2022 |
| JP | 2010-071936 A | 4/2010 |
| WO | 2021/076479 A1 | 4/2021 |

OTHER PUBLICATIONS

Dertouzos, M. L., et al., "Systems, Networks, and Computation: Basic Concepts", McGraw-Hill, New York, 1972, pp. 485-489.

(Continued)

*Primary Examiner* — Peguy Jean Pierre
(74) *Attorney, Agent, or Firm* — Rauschenbach Patent Law Group, PLLC; Kurt Rauschenbach

(57) ABSTRACT

A method for extended-pulse sampling includes providing a continuous-time signal comprising a frequency spectrum within a predetermined passband. The continuous time signal is sampled with a plurality of discrete sample pulses having a pulse shape in a time domain that is an impulse response of a filter having the predetermined passband. The plurality of discrete time samples of the continuous-time signal is then provided to an output.

41 Claims, 12 Drawing Sheets

(56) References Cited

U.S. PATENT DOCUMENTS

2008/0164863 A1    7/2008  Bogoni
2010/0232787 A1    9/2010  Otani et al.
2010/0246557 A1*   9/2010  Ishizaki ............... H04B 1/0007
                                                       370/343

OTHER PUBLICATIONS

Nyquist, H., "Certain Topics in Telegraph Transmission Theory", Transactions of the American Institute of Electrical Engineers, 1928, vol. 47, No. 2, pp. 617-644.
Schmid, H., "Electronic Analog/Digital Conversions", Van Nostrand Reinhold Co, New York, 1970, pp. 34-36.
Shannon, C.E., "Communication in the Presence of Noise", Proceedings of the Institute of Radio Engineers, 1949, vol. 37, No. 1, pp. 10-21.
International Search Report and Written Opinion received in PCT Application No. PCT/US2020/055335, mailed on Feb. 1, 2021, 9 page.
International Preliminary Report on Patentability received in PCT Application No. PCT/US2020/055335, mailed on Apr. 28, 2022, 7 pages.

* cited by examiner

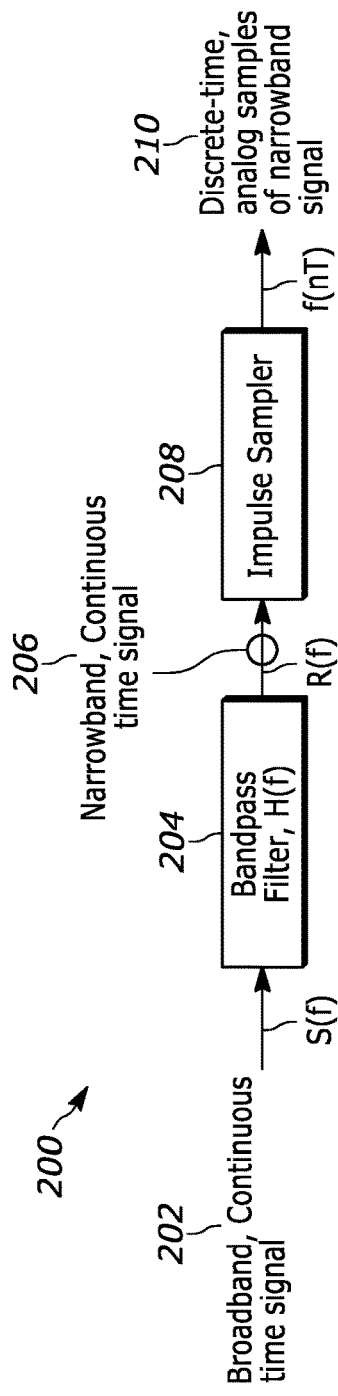
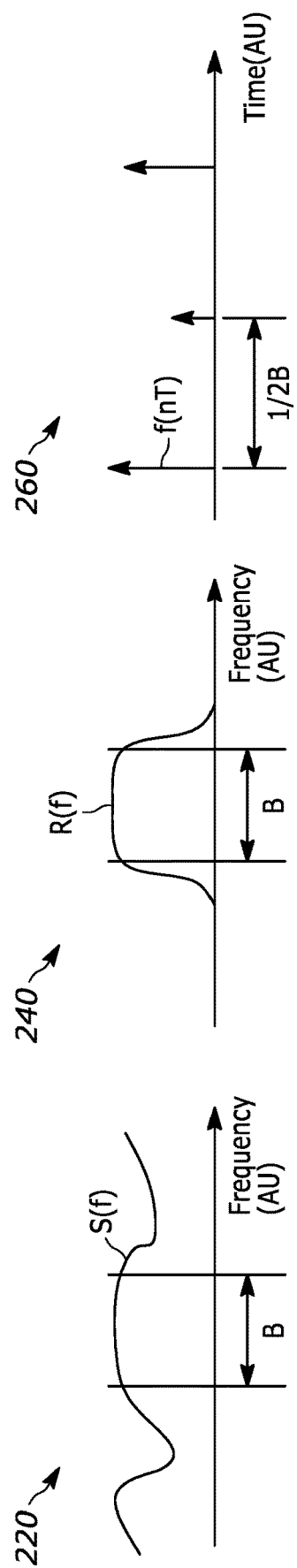

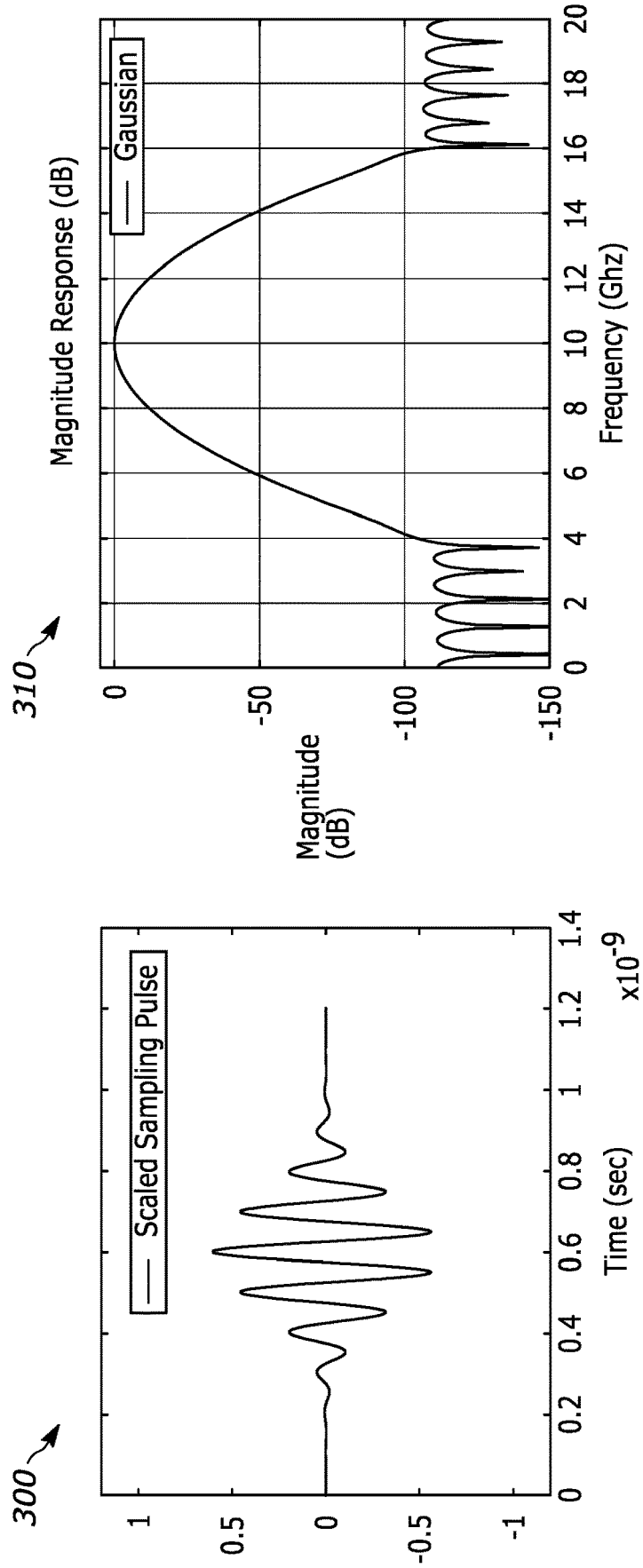

US 11,994,547 B2

EXTENDED PULSE SAMPLING SYSTEM AND METHOD

CROSS-REFERENCE TO RELATED APPLICATION

This is a 35 U.S.C. § 371 application based on International Patent Application No. PCT/US2020/055335, filed Oct. 13, 2020, entitled "Extended Pulse Sampling System and Method", which claims priority to U.S. Provisional Patent Application Number 62/915,593, filed on Oct. 15, 2019, entitled "Extended Pulse Sampling System and Method". The entire contents of International Patent Application No. PCT/US2020/055335 and U.S. Provisional Patent Application No. 62/915,593 are herein incorporated by reference.

The section headings used herein are for organizational purposes only and should not to be construed as limiting the subject matter described in the present application in any way.

INTRODUCTION

Sampling in signal processing converts a continuous-time signal to a discrete signal. The samples of a continuous-time signal can be used to recover that signal if a sampling frequency is greater than or equal to twice the highest frequency component of the continuous-time signal. In practice, signal reconstruction using sampling results in various deviations from a perfect reconstruction of the continuous-time signal. For example, signal aliasing is frequently a problem. Aliasing is addressed by applying low-pass and/or bandpass filters to the signal. Such filters are often referred to as anti-aliasing filters. These filters restrict the bandwidth of a continuous-time signal prior to sampling. For some systems, the implementation of an anti-aliasing filter is impractical, and so new methods and systems to remove aliasing from a sampled continuous-time signal are needed.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

FIG. 2A illustrates a known impulse sampler system that uses a bandpass, anti-alias filter.

FIG. 2B illustrates a frequency-domain plot of the broadband, continuous-time signal, with signal components that are outside the frequency band, B, which is to be sampled.

FIG. 2C illustrates a frequency-domain plot of a filtered version of the broadband continuous-time signal of FIG. 2B.

FIG. 2D illustrates a time-domain plot of a sampled version of the filtered continuous time signal of FIG. 2C.

FIG. 4A illustrates a time-domain plot of the impulse response of a bandpass filter with a Gaussian shaped passband.

FIG. 4B illustrates a frequency-domain plot of the bandpass filter with a Gaussian shaped passband illustrated in FIG. 4A.

DESCRIPTION OF VARIOUS EMBODIMENTS

Figure 1A:
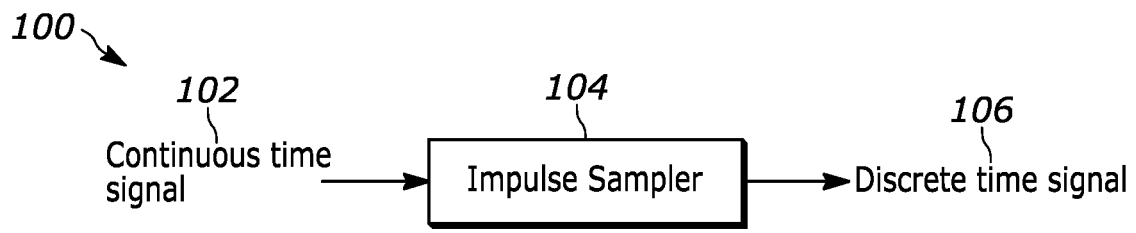
FIG. 1A illustrates a known impulse sampler system.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the method of the present teaching may be performed in any order and/or simultaneously as long as the teaching remains operable. Furthermore, it should be understood that the apparatus and method of the present teaching can include any number or all of the described embodiments as long as the teaching remains operable.

The present teaching will now be described in more detail with reference to exemplary embodiments thereof as shown in the accompanying drawings. While the present teaching is described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

The present teaching relates to a method and system for extended pulse sampling that improves the fidelity of a sampled representation of a signal and also helps to make sampling systems more practical to construct. A key technique in the communications art is the ability to represent a continuous, band-limited signal at baseband by a series of samples that are taken at discrete instants in time. The origins of sampling are largely due to the work of Nyquist and later Shannon who established that a continuous, band-limited signal can be completely represented by samples taken at a rate that is at least twice the highest frequency of the signal; this is the so-called Nyquist rate. See, for example, H. Nyquist, "Certain Topics in Telegraph Transmission Theory", *Transactions of the American Institute of Electrical Engineers*, Vol. 47, No. 2, pp. 617-644, 1928. See also, C. Shannon, "Communication in the Presence of Noise", *Proceedings of the Institute of Radio Engineers*, Vol. 37, No. 1, pp. 10-21, 1949. As presented in these references, ideally the sample, i.e. the value of the continuous signal, is captured at an infinitesimally short instant in time by an impulse function. In practice, the duration of the sampling impulse is short, typically less than 1% compared to the period of the highest frequency of the continuous signal. The deleterious effects of sampling with longer impulses have been well documented. See, for example, H. Schmid, *Electronic Analog/Digital Conversions*, Van Nostrand Reinhold Co, New York, 1970, pp. 34-36.

More recently, sampling techniques have been extended to sampling signals that have been modulated onto a high frequency carrier and then directly down-converting those signals to an intermediate frequency (IF) or even baseband. The direct down-conversion technique utilizes the fact that sampling below the Nyquist rate of the signal at RF generates copies, or aliases, of the continuous signal in various frequency bands. These are the so-called Nyquist zones, which are both above and below the frequency band of the original signal.

A potential issue with direct down conversion can arise when the input spectrum contains more than one signal, each of which is in a different frequency band. Since the frequency spectrum of an infinitesimally short impulse is flat and infinitely broad, sampling with such an impulse will create aliases of all the individual signals of the more than one signal at the input. All of these individual aliases will lose their separate identity in the aggregate sum of aliases that are created at baseband.

The prior art method of dealing with this issue is to place a filter, which in many cases is a bandpass filter, or other kind of band-limiting filter, often referred to as an anti-alias filter, prior to the sampler. This filter only passes the desired signal and filters out all the undesired signals. If the desired signal to be sampled is located in a fixed frequency band, the anti-alias filter can be a fixed frequency filter; if the frequency band of the desired signal can change, then either a bank of fixed frequency filters or a single, tunable anti-alias filter is needed. At present, tuning can be implemented either mechanically or electrically. Mechanical tuning can have a wide tuning range but is slow and bulky whereas electrical tuning can be fast and compact but has a tuning range of less than an octave. As such, there are engineering tradeoffs that must be made to implement these prior art anti-aliasing filters. This is especially true if it is a tunable filter that is needed.

A feature of the system and method of the present teaching is to provide a new technique that can implement filtering, such as anti-alias filtering, without the need for these prior art filters. In addition, the system and method of extended pulse sampling of the present teaching has numerous other beneficial functions that extend beyond providing the effect of anti-alias filtering without the need for a filter realized using conventional designs and components.

FIG. 1A illustrates a known impulse sampler system 100. A continuous time signal 102 is input to an impulse sampler 104 and a discrete time signal 106 is provided at the output of the impulse sampler 104. In known systems, all sampling was done with an impulse, or a pulse closely approximating an impulse, sampling function. This known method of impulse sampling is different from the extended-pulse sampling of the present teaching, which does not use impulse pulses, or very short-duration pulses to approximate impulses. Rather, the system and method of the present teaching uses longer duration pulses. For example, the duration of the extended sampling pulses exceeds 1% of the sampling time that is frequently used in known sampling systems. In some embodiments of the method of the present teaching, the extended pulse duration is nearly as long as, or even longer than, the inter-pulse sampling interval.

Figure 1B:
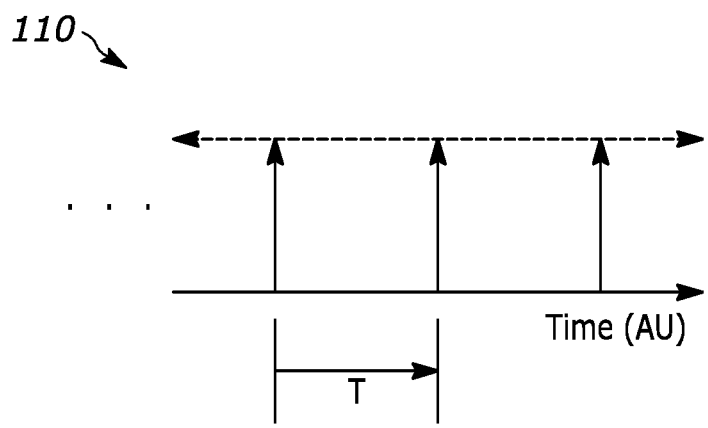
FIG. 1B illustrates a notional time-domain plot of an infinite succession of impulses.
Figure 1C:
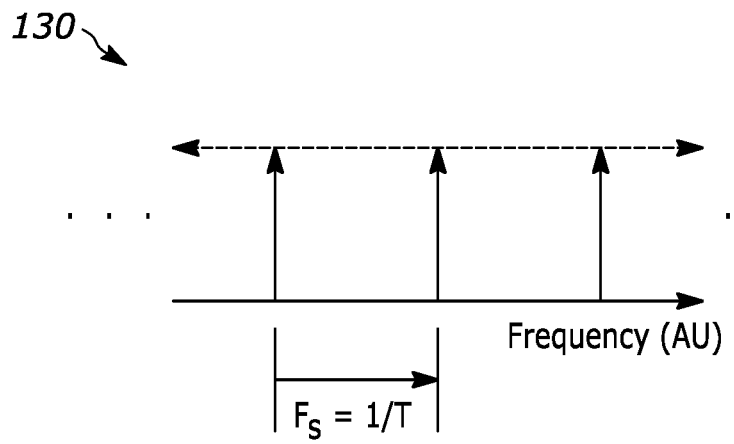
FIG. 1C illustrates flat frequency-domain plot of an infinite succession of impulses corresponding to the time-domain plot of FIG. 1B.

FIG. 1B illustrates a notional time-domain plot 110 of an infinite succession of impulses. The designation "AU" on the figure stands for arbitrary units. FIG. 1C illustrates a flat frequency-domain plot 130 of an infinite succession of impulses corresponding to the time-domain plot of FIG. 1B. We use the term "notional" since it is not possible to actually implement an infinitesimally short impulse function, rather in practice very short duration pulses are used.

The frequency spectrum of an ideal impulse is flat with respect to frequency. As the time duration of the sampling pulse, to, increases from zero, the corresponding frequency spectrum takes on the well-known Sin(x)/x, or Sinc, function, with the magnitude going to zero for $n/t_0$. See, for example, H. Schmid, *Electronic Analog/Digital Conversions*, Van Nostrand Reinhold Co, New York, 1970, pp. 34-36. The result is a roll off in the frequency response of the sampled signal relative to the frequency response of the original signal. Thus, the thinking associated with known sampling techniques is that increasing the width of the sampling pulse leads to an undesired effect. One aspect of the system and method of the present teaching is the recognition that longer duration pulses of an appropriate shape can be advantageously used to provide high-fidelity sampling of a signal.

FIG. 2A illustrates a known impulse sampler system 200 that uses a bandpass, anti-alias filter. A broadband continuous time signal 202, which we denote in the frequency domain as S(f), is input to a bandpass filter 204. The frequency response of the filter is denoted in the frequency domain as H(f). The resulting signal in a narrow-band, continuous-time signal 206 at an output. This is denoted by frequency response: R(f)=S(f)×H(f). The narrow-band, continuous-time signal 206 is input to an impulse sampler 208. A discrete time signal 210 is provided at the output of the impulse sampler 208. The discrete time signal 210 is a discrete time series of impulses representing the analog value of the narrowband continuous time signal, and is denoted f(nT). The passband filter 204 has a passband bandwidth, B.

FIG. 2B illustrates a frequency-domain plot 220 of the broadband, continuous-time signal, with signal components that are outside the frequency band, B, which is to be sampled. FIG. 2C illustrates a frequency-domain plot 240 of a filtered version of the broadband continuous-time signal of FIG. 2B. Referring to FIGS. 2A-B, the plot 240 illustrates the result of filtering the broadband, continuous-time through the bandpass, anti-alias filter 204 to produce a narrowband continuous-time signal 206. The result is that frequency components outside the passband, B, have been attenuated.

FIG. 2D illustrates a time-domain plot 260 of a sampled version of the narrowband continuous time signal. Referring to FIGS. 2A-D, the plot 260 shows the result of impulse sampling by sampler 208. The result is a discrete time series of impulses, which is discrete time samples of narrowband signal 206 that represent the value of the narrowband continuous time signal 206. The narrowband signal may be a particular desired signal that is part of the broadband continuous time signal 202 presented at the input of the filter 204.

One feature of the present teaching is that it reduces or eliminates the need for a tunable filter for anti-aliasing. The issue with making an electrically tunable filter is that despite intensive research into myriad technologies none has been found that enables wide tunability. For example, varactors, which are electrically adjustable capacitors, have an adjustment range of less than 4:1. And since the resonant frequency of an inductor-capacitor, LC, tuned circuit is proportional to the square root of the product of the L and C values, a varactor tuned circuit can tune over a frequency range of <2:1, which is less than an octave.

It is well known in the electrical art that electrical components are equally well characterized by either of two domains, the time domain or the frequency domain. These two descriptions are equivalent. That is, they each contain the same information; one has no more or no less information than the other. We use whichever domain is more convenient for the problem at hand. In some cases, the domain is implicit in the name commonly used to refer to the component. For example, it is typical to describe the sampling function as an impulse function, which is a time domain description. Similarly, it is typical to refer to filters by their frequency domain performance, i.e. low pass, band pass, etc., which are all frequency domain terms. But these components and other components are equally characterized in the "other" domain, i.e. the frequency domain for an impulse function and the time domain for a filter. These alternate domain descriptions are less intuitively descriptive of the function and consequently they are rarely, if ever, used.

The system and method of the present teaching relies on the recognition that the function of an actual filter, which is normally represented in the frequency domain as H(f), can be equally well implemented by synthesizing the filter's impulse response in the time domain as h(t), which is the inverse Fourier transform of H(f). Thus, it is possible to realize the frequency response of a bandpass filter by synthesizing the impulse response of a bandpass filter. The system and method of the present teaching replaces the prior art impulse sampling function with a sampling signal that is the impulse response of the desired filter, such as a bandpass, anti-alias filter. This results in a continuous-time signal that has been bandpass filtered by the sampling process itself. That is, there is no need for a separate bandpass filter, yet the sampled signal has substantially no aliasing.

It is well known in the electrical art that multiplication of two functions in the frequency domain is equivalent to convolution of the inverse Fourier transforms of these functions in the time domain. Thus, an equivalent time domain expression of R(f)=S(f)×H(f), discussed above, is r(t)=∫$_{-\infty}^{\infty}$h(t−τ)s(τ)dτ. Hence, by multiplying the input signal by the time-reversed and translated filter impulse response and then integrating, the equivalent output to the filtered output R(f) is obtained. For further instruction regarding the convolution integral see, for example, Section 11.11 of M. L. Dertouzos, M. Athans, R. N. Spann and S. J. Mason, Systems, Networks, and Computation: Basic Concepts, McGraw-Hill, New York, 1972, pp. 485-489.

Figure 3:
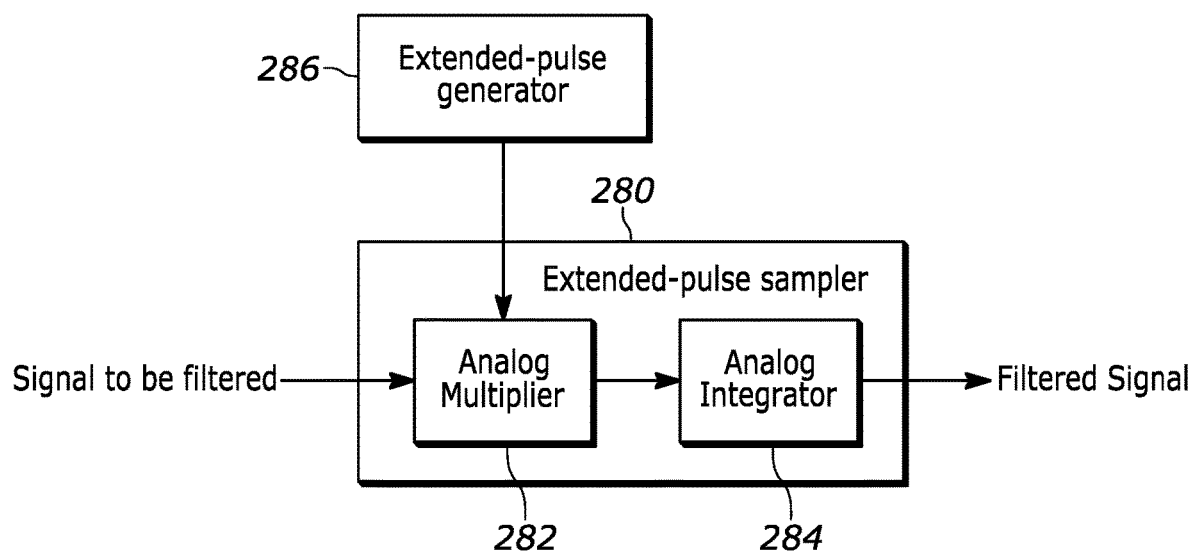
FIG. 3 illustrates an implementation of an extended-pulse sampler implemented using a series combination of an analog multiplier and an analog integrator.

One method of implementing extended pulse sampling according to the present teaching is to utilize a series combination of an analog multiplier and an analog integrator. FIG. 3 illustrates an implementation of an extended-pulse sampler 280 implemented using a series combination of an analog multiplier 282 and an analog integrator 284. The signal to be filtered, which may be a continuous-time, broadband signal, is applied to an input port of the analog multiplier 282. A time-reversed and translated extended-sampling pulse is generated using digital techniques in an extended pulse generator 286 and this extended sampling pulse is applied to a second input port of the analog multiplier 282. The output of the analog multiplier 282 is electrically connected to the input of an analog integrator 284. The resulting filtered input signal is generated by the output of the analog integrator 284. Electronic circuits for implementing both an analog multiplier 282 and integrator 284 are well known to those in the electrical engineering art.

Another method of sampling an electrical signal using either impulses or extended pulse samples is to apply the electrical signal to the electrodes of an electro-optic modulator and to provide pulsed light rather than continuous-wave (CW) light to the modulator's optical input port. See, for example, G. Betts and C. Cox, "Photonically-sampled electrically quantized analog-to-digital converter," and U.S. Pat. No. 10,514,588, issued Dec. 24, 2019. The modulated output optical field from a Mach-Zehnder (MZ) interferometric electro-optic modulator, for example, is $$E_{modulated}(t) = \int_{-\infty}^{\infty} -\frac{1}{\sqrt{2}} j\omega_o E_{optical}(t-\tau) \cos\left(\frac{\pi}{2}\frac{V_{electrical}(\tau)}{V_\pi}\right) d\tau,$$

where $E_{optical}$ and $V_{electrical}$ are the input optical field and input electrical voltage, respectively, $\omega_0$ is $2\pi$ times the optical frequency, and $V_\pi$ is the full on-off switching voltage of the MZ modulator. It can be seen that $E_{modulated}(t)$ in this expression is equal to r(t) in the expression r(t)=∫$_{-\infty}^{\infty}$h(t−τ)s(τ)dτ if we define $$h(t-\tau) = -\frac{1}{\sqrt{2}} j\omega_o E_{optical}(t-\tau) \text{ and } s(\tau) = \cos\left(\frac{\pi}{2}\frac{V_{electrical}(\tau)}{V_\pi}\right).$$

Therefore, an equivalent frequency-domain expression for the modulated output optical field is R(f)=S(f)×H(f), where $$R(f) = E_{modulated}(f), \ S(f) = \cos\left(\frac{\pi}{2}\frac{V_{electrical}(f)}{V_\pi}\right),$$

$$\text{and } H(f) = -\frac{1}{\sqrt{2}}j\omega_o E_{optical}(f).$$

We refer to the extended pulse shape that is the impulse response of the desired anti-alias filter shape (e.g. bandpass filter shape), as an extended pulse. A major advantage of this sampled filter is that electronic tuning can be accomplished by changing the impulse response in a manner that corresponds to the tuning of the filter response in the frequency domain.

FIG. 4A illustrates a time-domain plot 300 of the impulse response of a bandpass filter with a Gaussian shaped passband. FIG. 4B illustrates a frequency-domain plot 310 of the filter illustrated in FIG. 4A. Thus, FIGS. 4A-B show an impulse response and corresponding frequency response of a Gaussian bandpass filter. Since these two domains are alternative ways to view the same filter, we can synthesize this filter using either a frequency domain synthesis to find a circuit with the appropriate inductors and capacitors or, we can use a time domain synthesis to generate the corresponding impulse response. Note, however, that the physical realizations of these two methods of synthesizing a filter are very different, resulting in different engineering design considerations and performance trade-offs. One feature of the present teaching is the recognition that a time-domain impulse response can be a superior method to provide anti-aliasing in a sampled continuous-time signal. This extended-pulse sampling system and method can result in a significantly simpler and more effective sampler than those that rely on conventional frequency-domain filters. As one example, extended pulse sampling can eliminate the need for a tunable filter for some kinds of sampled systems. For example, filters can be needed when a desired signal to be sampled is accompanied by another signal, which may be in a separate part of the frequency spectrum from the desired signal. Tunable filters may be needed, for example, if the desired input signal changes in frequency.

One skilled in the art will appreciate that while a Gaussian-shaped filter is described herein as one example, the present teaching is not limited to the use of a Gaussian-shaped filter and associated impulse response. Numerous other filter shapes can be used that provide the desired passband to pass the desired signal. Also, it is important to note that the bandpass filter's impulse response extends over several cycles of the center frequency around which the passband is centered. This is in stark contrast to the impulse sampler whose infinitesimally short pulse width is well less than one cycle of the center frequency around which the passband is centered.

Figure 4C:
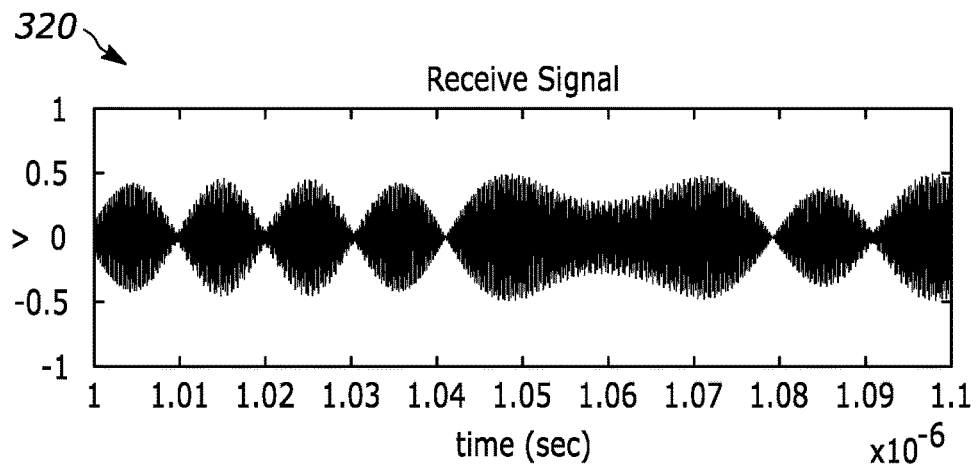
FIG. 4C illustrates a time-domain plot of a receive signal.
Figure 4D:
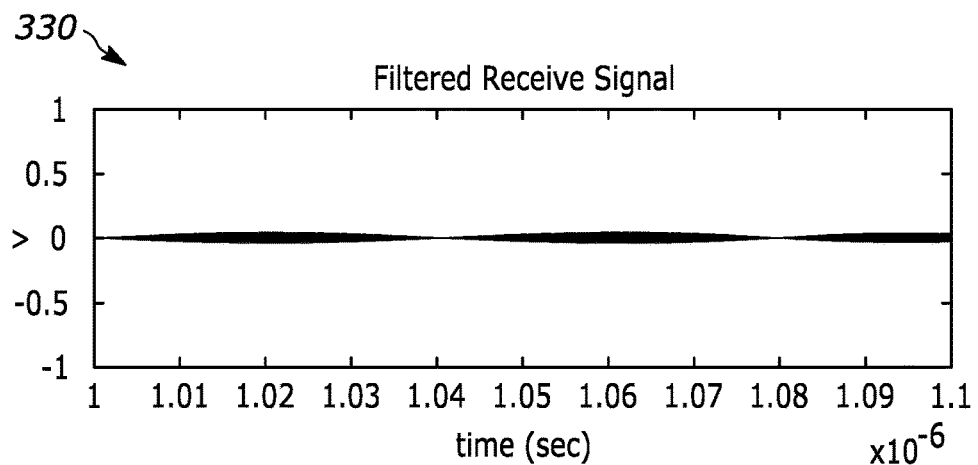
FIG. 4D illustrates a time-domain plot of a filtered version of the receive signal of FIG. 4C.
Figure 4E:
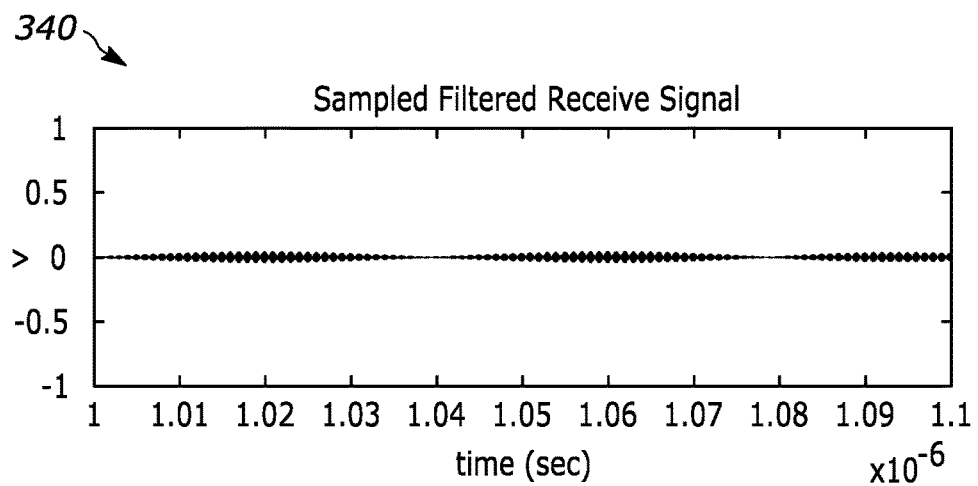
FIG. 4E illustrates a time-domain plot of a sampled filtered receive signal of the receive signal of FIG. 4C.
Figure 4F:
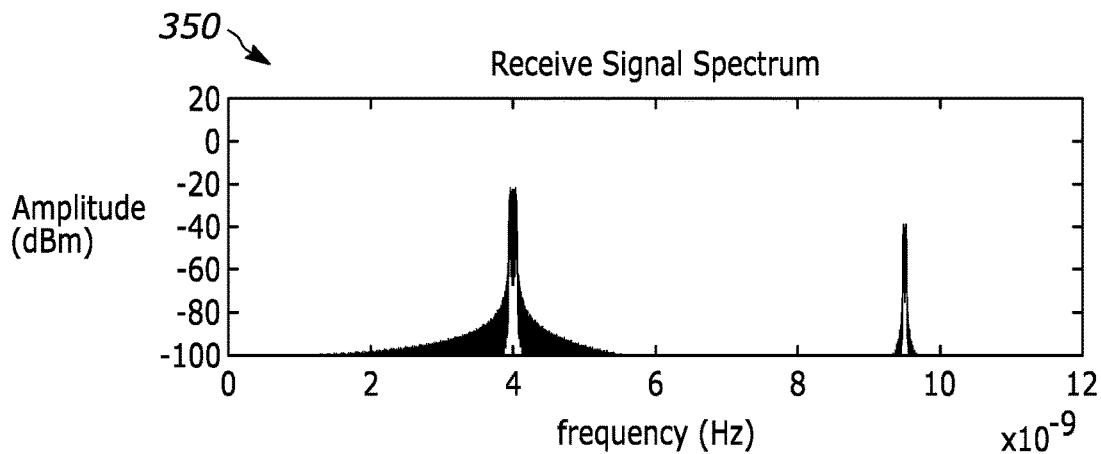
FIG. 4F illustrates a frequency-domain plot of the receive signal of FIG. 4C.
Figure 4G:
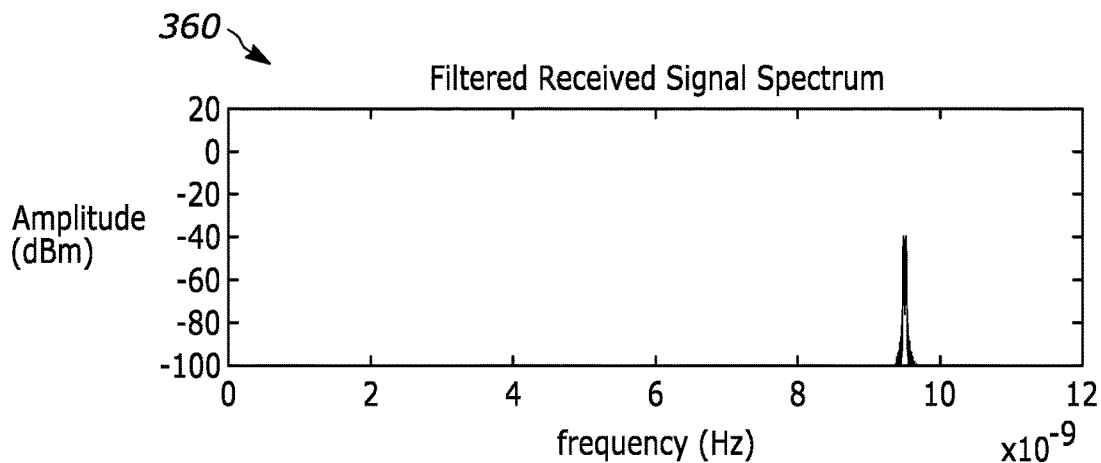
FIG. 4G illustrates a frequency-domain plot of a filtered version of the receive signal of FIG. 4C.
Figure 4H:
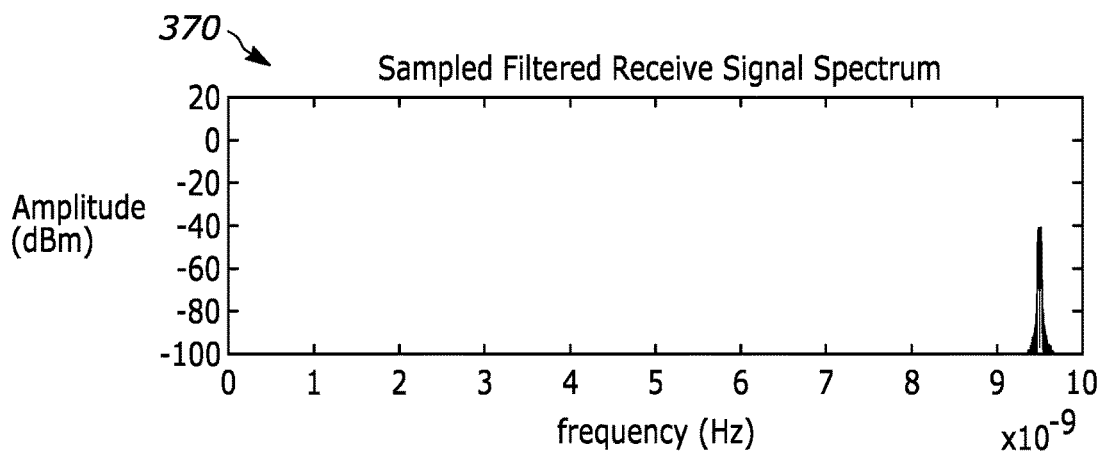
FIG. 4H illustrates a frequency-domain plot of a sampled filtered receive signal of the receive signal of FIG. 4C.

FIGS. 4C-H illustrate a simulation of the effect a Gaussian bandpass filter followed by an impulse sampler on a receive signal. This could represent, for example, a system like that described in connection with FIG. 2A. This simulation of FIG. 4C illustrates a time-domain plot 320 of a receive signal. FIG. 4D illustrates a time-domain plot 330 of a filtered version of the receive signal of FIG. 4C. FIG. 4E illustrates a time-domain plot 340 of a sampled filtered receive signal of the receive signal of FIG. 4C. FIG. 4F illustrates a frequency-domain plot 350 of the receive signal of FIG. 4C. FIG. 4G illustrates a frequency-domain plot 360 of a filtered version of the receive signal of FIG. 4C. FIG. 4H illustrates a frequency-domain plot 370 of a sampled filtered receive signal of the receive signal of FIG. 4C. Referring to all of FIGS. 4C-H, the plots 320, 350 show an input receive signal, in both the time domain, plot 320, and the frequency domain, plot 350. The input receive signal includes two signals, one of which has a spectrum that falls within the passband of the filter and the other signal has a spectrum that does not fall within the passband of the filter. The plots 330, 360 show the receive signal after filtering, where the out-of-band signal has been suppressed. The plots 340, 370 show the output after sampling.

Figure 5A:
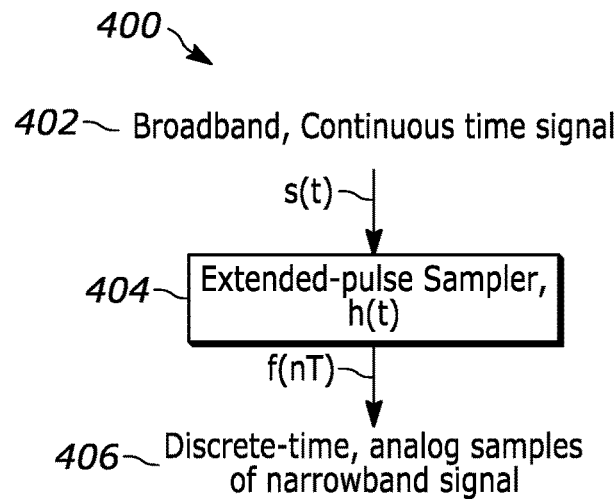
FIG. 5A illustrates an embodiment of an extended-pulse sampling system according to the present teaching.

FIG. 5A illustrates an embodiment of an extended-pulse sampling system 400 according to the present teaching. A continuous time signal 402 is input to an extended pulse sampler 404. A discrete time signal 406 is provided at the output of the extended pulse sampler 404. In this system 400, extended-pulse sampling with the bandpass filter impulse response shown in FIG. 4A is used to simultaneously filter and sample as an example.

Figure 5B:
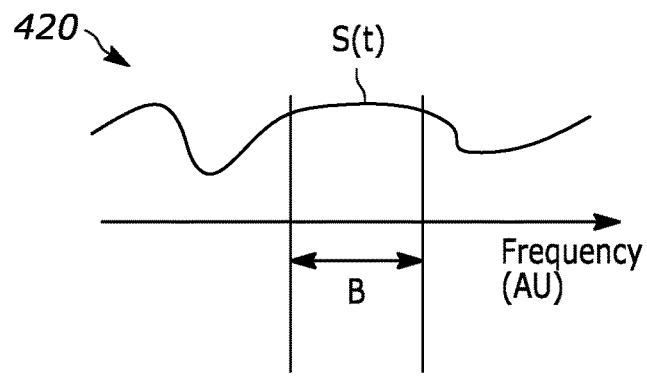
FIG. 5B illustrates a frequency-domain plot of a broadband, continuous-time signal, with signal components that are outside the frequency band, B, which is to be sampled.
Figure 5C:
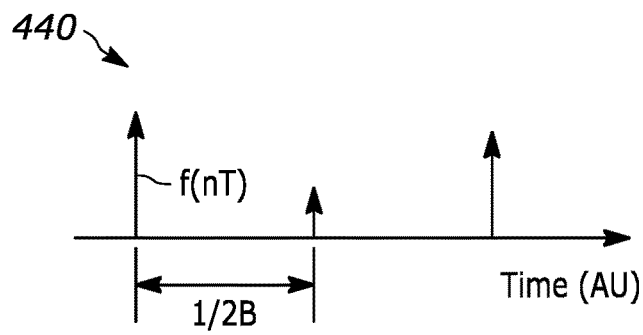
FIG. 5C illustrates a frequency-domain plot of a filtered version of the broadband continuous-time signal of FIG. 5B.

FIG. 5B illustrates frequency-domain plot 420 of a broadband, continuous-time signal, with signal components that are outside the frequency band, B, which is to be sampled. FIG. 5C illustrates a frequency-domain plot 440 of a filtered version of the broadband continuous-time signal of FIG. 5B. Note that the resulting response following sampling is the same at the response following sampling that was illustrated in FIG. 2D which used a conventional bandpass filter followed by conventional impulse sampling. In other words, the response, f(nT), resulting from use of the direct extended pulse sampling using r(t)=$\int_{-\infty}^{\infty}$h(t−τ)s(τ)dτ is the same as the response f(nT) that resulted from conventional bandpass followed by conventional impulse sampling of FIG. 2D. However, there is no bandpass filter used in extended-pulse sampling system 400.

Figure 6C:
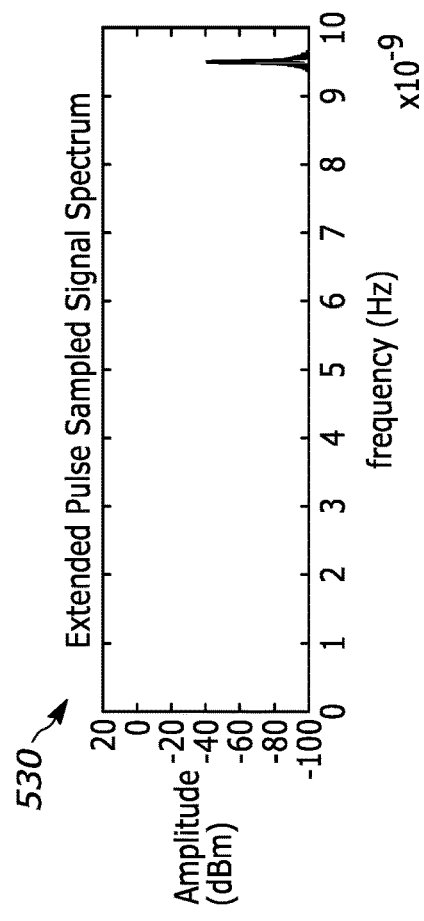
FIG. 6C illustrates a frequency-domain plot of the receive signal of FIG. 6A.
Figure 6D:
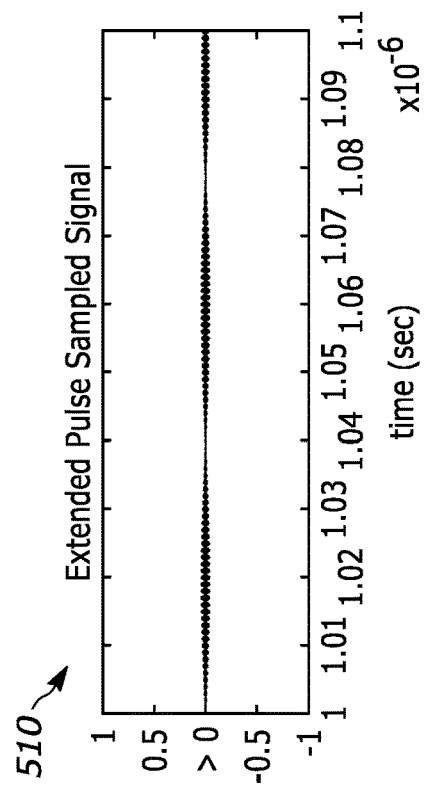
FIG. 6D illustrates a frequency-domain plot of an extended pulse sampled representation of the receive signal of FIG. 6A.
Figure 6A:
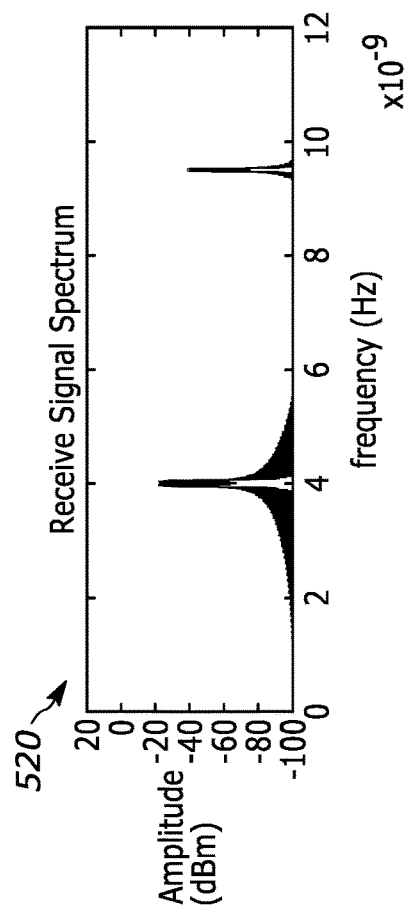
FIG. 6A illustrates a simulation of a time-domain plot of a receive signal in an extended pulse sampling system and method of the present teaching.
Figure 6B:
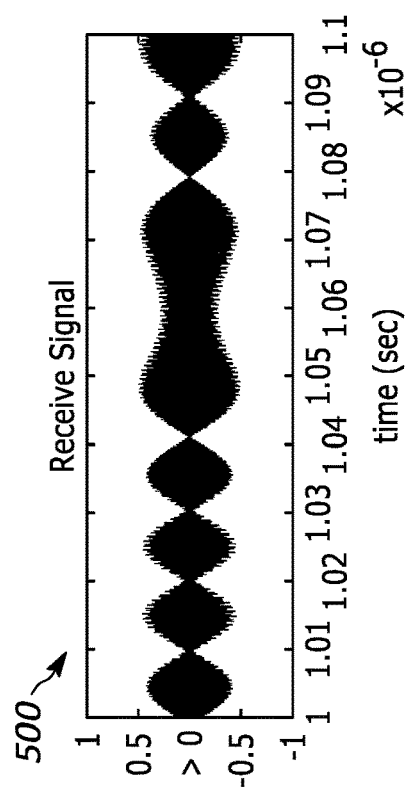
FIG. 6B illustrates a time-domain plot of an extended pulse sampled representation of the receive signal of FIG. 6A.

FIGS. 6A-D illustrate a simulation of the effect an extended-pulse sampler of the present teaching has on a receive signal. FIG. 6A illustrates a simulation of a time-domain plot 500 of a receive signal in an extended pulse sampling system and method of the present teaching. FIG. 6B illustrates a time-domain plot 510 of an extended pulse sampled representation of the receive signal of FIG. 6A. FIG. 6C illustrates a frequency-domain plot 520 of the receive signal of FIG. 6A. FIG. 6D illustrates a frequency-domain plot 530 of extended pulse sampled representation of the receive signal of FIG. 6A. The impulse response of the extended sampling pulse corresponds to a Gaussian bandpass filter in the frequency domain. The plots 500, 520 show an input, in both the time domain, plot 500, and in the frequency domain, plot 520. The receive signal includes two signals, one signal is within the passband of the filter and the other signal is not. The plots 510, 530 show the output after extended-pulse sampling. It is clear that the out-of-band signal has been suppressed, even though no filter is used. Note that the output of the extended-pulse sampler, which are shown in plots 510, 530 are identical to the output of the filter followed by an impulse sampler, which are shown in FIGS. 4E and 4H as plots 340, 370. These data support the teaching of the present disclosure that extended-pulse sampling yields the same result as filtering followed by impulse sampling.

As is understood by those skilled in the art, the width of the frequency domain response of a filter is inversely related to the duration of its corresponding impulse response in the time domain. The time between samples, whether impulse or extended, is set by the Nyquist rate. Hence this inter-sampling pulse period is also related to the bandwidth, B, of the filter; and it must be <1/2B. Hence, depending on the bandwidth of the filter, it is likely that the duration of the filter's impulse response will be longer than the inter-sampling pulse period. In this case, the extended-pulse sampling pulses will overlap in time.

Figure 7A:
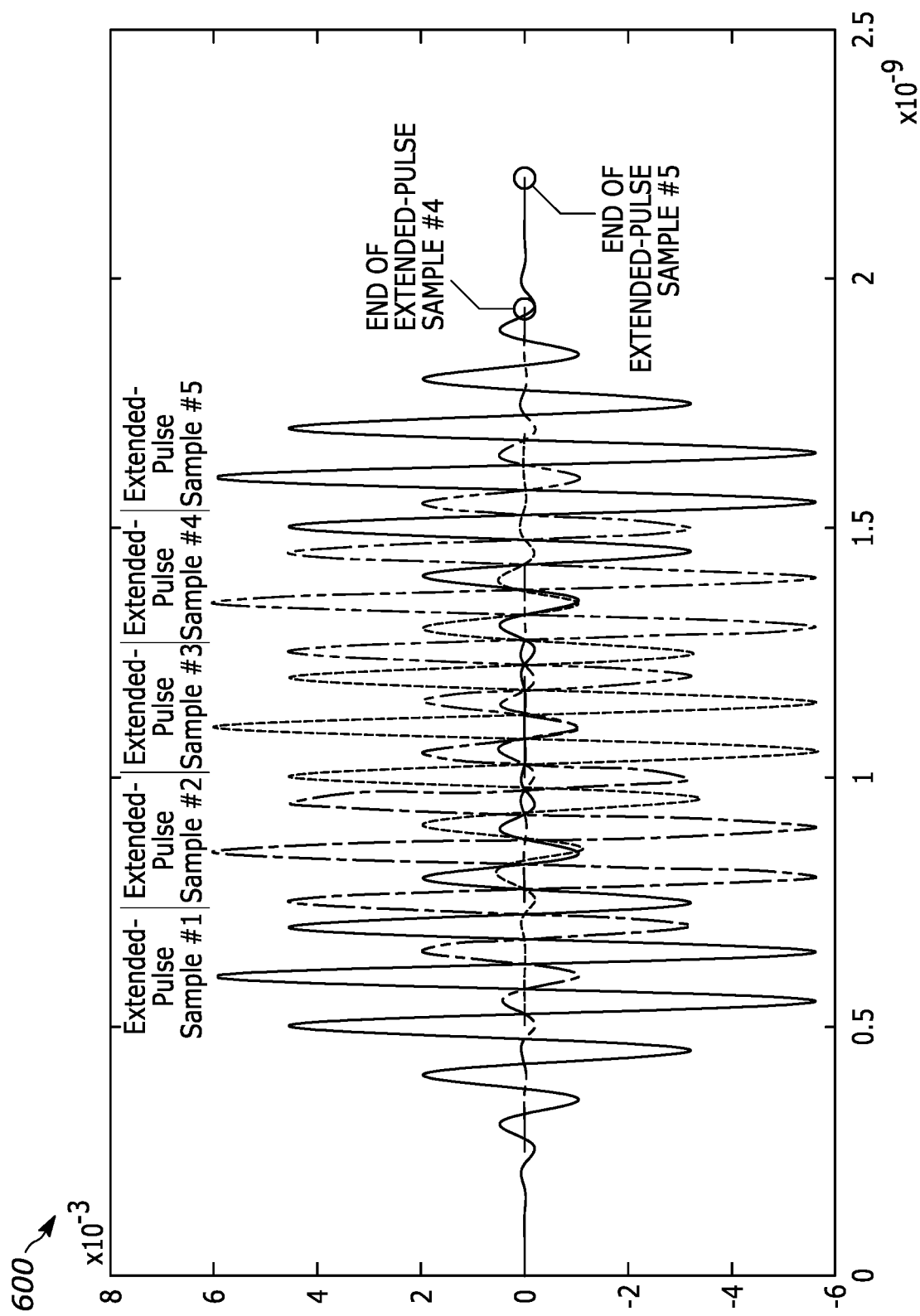
FIG. 7A illustrates a plot of individual sampling pulses forming an extended pulse sampling waveform as a function of time according to the present teaching.

FIG. 7A illustrates a plot 600 of individual sampling pulses forming an extended pulse sampling waveform as a function of time according to the present teaching. This extended pulse sampling waveform is an example of a case where the extended-pulse sampling pulses overlap in time.

Figure 7B:
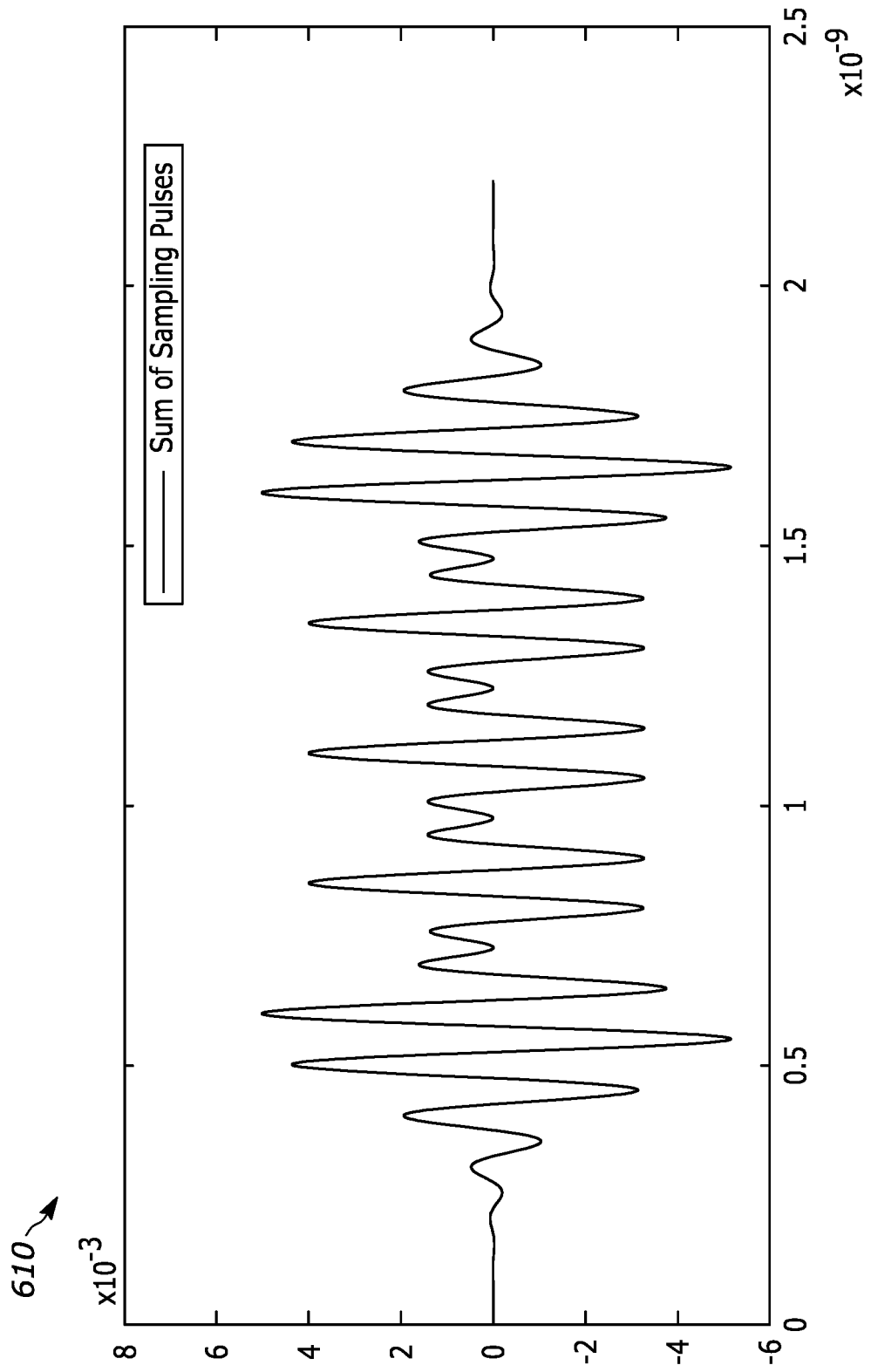
FIG. 7B illustrates a plot of the running sum of individual sampling pulses shown in FIG. 7A.

FIG. 7B illustrates a plot 610 of the sum of individual sampling pulses of FIG. 7A. The running sum of these pulses, as plotted in FIG. 7B, shows that the extended pulse has lost the shape that corresponded to the desired filter frequency response. As such, a mechanism to maintain the information of the individual samples with the extended sample pulse waveform and duration is needed.

The output of the discrete time sampled signals from the extended-pulse sampler can be quantized. The quantization may be performed in an analog-to-digital converter (ADC). Referring to right end of the plot 600 of FIG. 7A, it is clear that the end of extended-pulse sample #4, which is shown by the dash-dot curve, ends before the end of extended-pulse sample #5, which is shown by the solid curve. As a result, a single analog-to digital converter (ADC) can quantize all these samples as they are output from the extended-pulse sampler. However, the sampling of the broadband continuous-time signal needs to be performed separately for each extended pulse sample to maintain fidelity.

Figure 8:
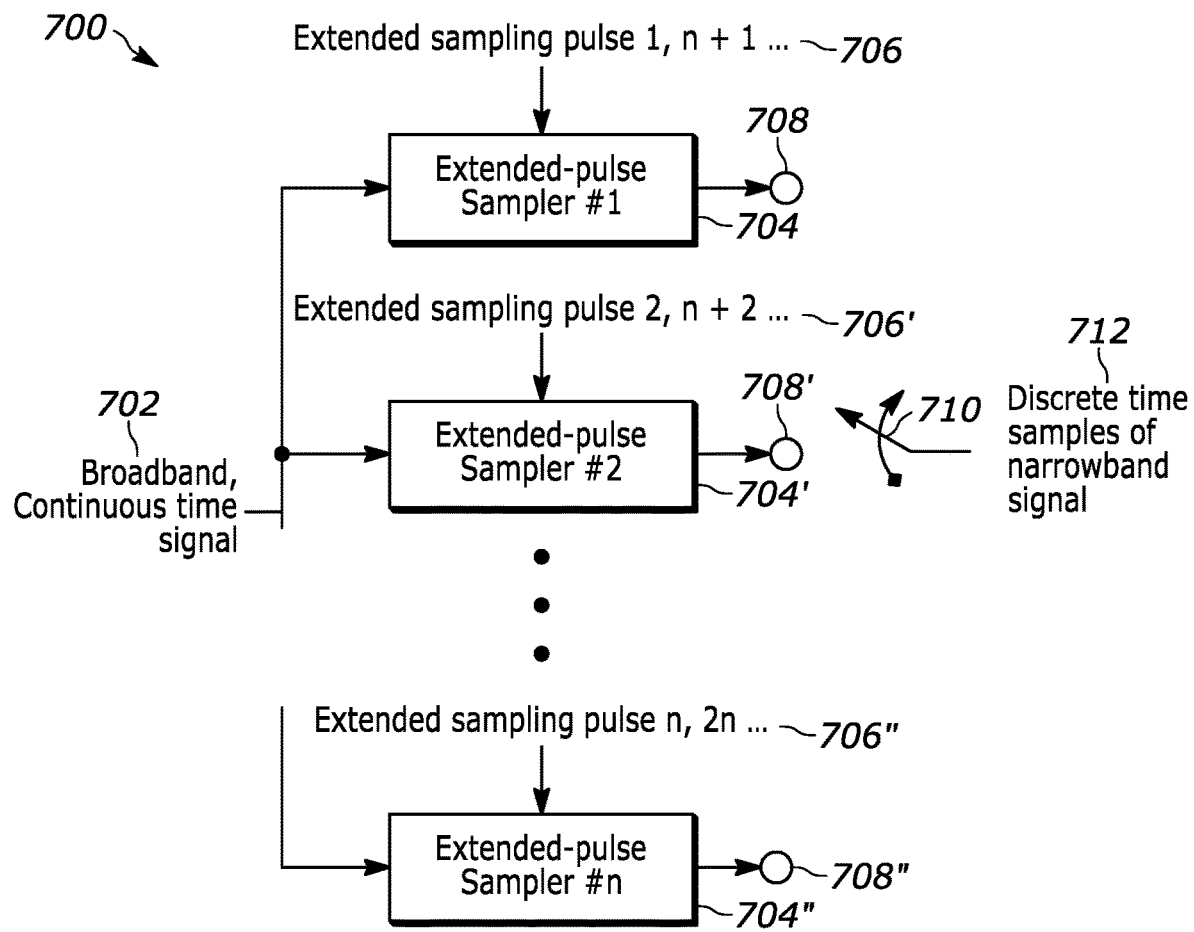
FIG. 8 illustrates an embodiment of a system and method of the extended pulse sampler of the present teaching that uses multiple parallel samplers.

As a result of the potential for overlapping sampling pulses, some embodiments of the present teaching handle successive extended sampling pulses separately. FIG. 8 illustrates an embodiment of a system and method of extended pulse sampling 700 of the present teaching that uses multiple parallel samplers. A broadband continuous-time signal 702 is provided at an input. The signal 702 is split into multiple paths that are input to individual extended pulse samplers 704, 704', 704". The number of samplers 704', 704', 704", n, depends upon, for example, how much the time duration of the individual sampling pulses exceeds the sampling period, (e.g. <1/2B). Each sampler 704, 704', 704" is triggered by a trigger signal 706, 706', 706". The trigger signals 706, 706', 706" are repetitive at every $n^{th}$ time slot, and offset from one another by the high-speed sampling period. Thus, a sample is taken at every sampling time from a particular one of the samplers 704, 704', 704" and provided at a respective output 708, 708', 708". A switch 710 is used, with an input that connects to each output 708, 708', 708" at the sample time set by the triggers 706, 706', 706". The output of the switch 710 provides a discrete time sample 712 of the broadband continuous signal, with anti-aliasing. No analog filters are required to provide the anti-aliasing. By sampling with an extended pulse shape, that is an impulse response of a passband filter that passes the broadband continuous signal 702, no filter is required to, e.g. separate the broadband continuous-time signal 702 from other signals with spectrums that are not in the passband. Individual extended-pulse samples are routed to separate analog-to-digital converters, ADCs. The number of separate ADCs required depends on the time until the filter's impulse response has died down to a sufficiently low level, which in turn depends on the accuracy of the frequency domain response one needs to achieve. This results in discrete time samples of a narrowband signal.

Figure 9:
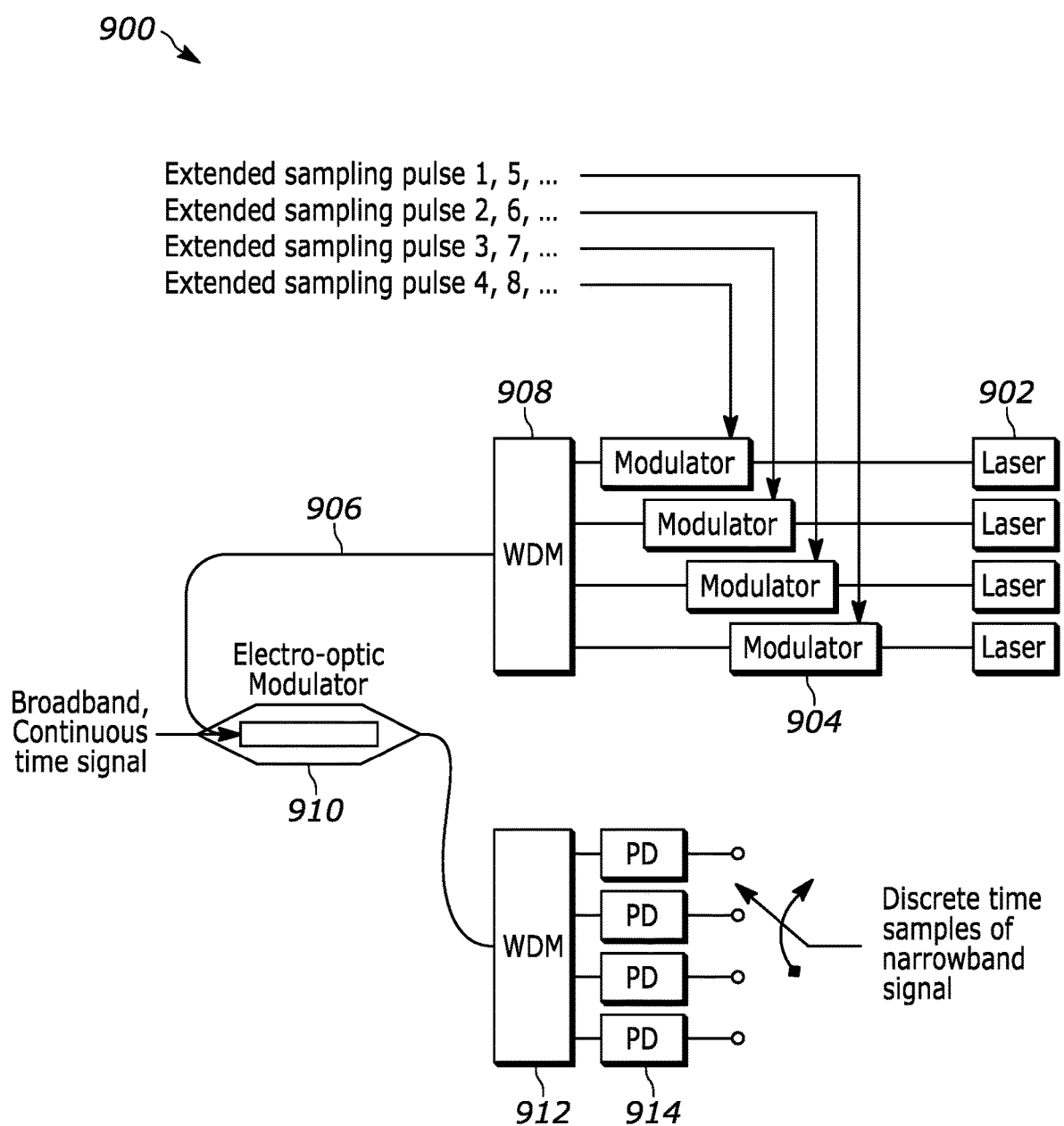
FIG. 9 illustrates an embodiment of an extended pulse sampler of the present teaching that includes a plurality of lasers, where each of the plurality of lasers generates an optical beam with a different optical wavelength to which is applied one of a plurality of parallel sampling waveforms, all of which are made to sample the broadband continuous time signal that is applied to a single electro-optic modulator.

FIG. 9 illustrates an embodiment of an extended pulse sampler 900 of the present teaching that includes a plurality of lasers, where each of the plurality of lasers generates an optical beam with a different optical wavelength to which one of a plurality of parallel sampling extended sampling pulses is applied. In the configuration shown in FIG. 9, there are four lasers 902 and four modulators 904 enabling the light from the four lasers to be modulated by four extended sampling pulses, but it is understood that the present teaching is not limited by the number of parallel samplers. In this embodiment, an optical signal at each wavelength of each of the four lasers 902 is modulated using a modulator 904 with an extended sampling pulse associate in every fourth slot. That is, a first laser is modulated with the first, fifth, ninth, etc. pulse. A second laser is modulated with a second, sixth, tenth, etc. pulse. Like the embodiment described in connection with FIG. 8, the extended pulse sampler 900 uses multiple parallel samplers. However, the extended pulse sampler 900 has the additional advantage of not requiring the splitting of the broadband, continuous-time input signal into multiple copies that would, necessarily, be lower-power copies because of inherent splitting loss. In the extended pulse sampler 900, the power of the multiple sampled signal copies can be equal, and is determined by a laser power, WDM combining loss, and other residual losses, but is independent of the number of copies, that is independent of the number of WDM channels.

Another feature of the extended pulse sampler 900 is that a single modulator 910 is used on all of the WDM channels generated by a laser 902 and modulator 904 that is modulated by an extended sampling pulse. The embodiment of the extended pulse sampler 900 shown in FIG. 9 leverages the fact that an electro-optic modulator can be used to perform the analog multiplication and subsequent analog integration as described in connection with FIG. 3. This analog multiplication and integration function of the electro-optic modulator 910 on the WDM multiplexed and modulated with extended sampling pulse optical signals achieves the convolution of the electrical input signal to the modulator with the samples in the time domain. The result is the equivalent of filtering in the frequency domain as described herein.

An additional advantage of using the electro-optic modulator to perform convolution is that such modulators can perform these steps efficiently at frequencies from baseband up to 100 GHz or more. As shown in FIG. 9, the convolution of multiple parallel samples with the input signal using a single electro-optic modulator 910 is enabled by the use of a broadband optical source to generate optical carriers at multiple distinct optical wavelengths. This broadband optical source can include individual lasers to generate each of the necessary distinct wavelengths, which, in the example shown in the FIG. 4, is four lasers.

Each of these distinct optical wavelengths generated by a laser 902 is modulated by a different extended sampling pulse that is applied to a distinct modulator 904. The four wavelengths of light carrying the four different sampling pulses are then combined into a single optical waveguide 906 using a wavelength-division multiplexer (WDM) 908. A broadband optical combiner (not shown) could also be used to combine the optical beams, but not as efficiently as the WDM 908 because of the inherent loss of optical power at the individual wavelengths. The output 906 of the WDM 908 is then optically coupled to the optical input to an electro-optic modulator 910. The optical modulator 910 receives the broadband continuous-time electrical signal to be sampled as an electrical input and generates an optical signal that comprises the four wavelengths of light carrying the four parallel sets of sampling pulses that are each convolved with the broadband continuous-time electrical signal. A second WDM 912 separates the modulated optical signal into four optical beams, each having a separate wavelength. That is, each of the four wavelengths of light carrying the four parallel sets of sampling pulses that are each convolved with the broadband continuous-time electrical signal are separated by the second WDM 912. Each of the now separated four optical signals are then detected using one of four separate photodiode (PD) detectors 914. A switch can be used to provide discretized outputs of time samples of the signal. In this way, discrete time samples of narrowband signals may be provided.

The sampling system and method of the present teaching can be used in conjunction with numerous known signal processing systems that rely on sampling. As one specific example, the system and method of the present teaching can be used in a receiver for a wireless communication system. In these embodiments, a desired signal can be collected, for example, by an antenna together with one or more undesired signals that have frequency spectra that do not overlap with the desired signal. The extended pulse shape and duration are based on a time-domain impulse response of a bandpass filter that is designed to select and pass the desired signal while nominally blocking the other, undesired signals.

In some embodiments, the discrete time signal that is sampled by the extended pulse sampler is sent to an analog-to-digital converter that produces a quantized version of the sampled signal. There are many possible applications of the methods according to the present teaching. For example, in some embodiments, the desired signal is a cellular wireless signal that operates in a known cellular frequency band. In other embodiments, the desired signal is a WiFi signal that operates in a known WiFi frequency band. The desired signal can be a known wireless signal that operates in a known wireless frequency band. In yet other embodiments, the desired signal is a satellite signal.

One skilled in the art will appreciate that there are numerous other applications of the extended pulse sampling systems and methods of the present teaching. For example, the present teachings apply to audio and video processing and, in particular, various image processing applications including two-dimensional and three-dimensional imaging applications. In these embodiments, the continuous-time signal of interest may comprise audio, video or image information.

EQUIVALENTS

While the Applicant's teaching is described in conjunction with various embodiments, it is not intended that the Applicant's teaching be limited to such embodiments. On the contrary, the Applicant's teaching encompass various alternatives, modifications, and equivalents, as will be appreciated by those of skill in the art, which may be made therein without departing from the spirit and scope of the teaching.

What is claimed is:

1. A method of extended-pulse sampling, the method comprising:
    a) providing a continuous-time signal comprising a frequency spectrum within a predetermined passband;
    b) sampling the continuous time signal with a plurality of discrete sample pulses having a pulse shape in a time domain that is an impulse response of a filter having the predetermined passband; and
    c) providing the plurality of discrete time samples of the continuous-time signal to an output.

2. The method of claim 1 wherein the plurality of discrete sample pulses is spaced by a sampling time.

3. The method of claim 2 wherein the sampling time is a Nyquist sampling time.

4. The method of claim 2 wherein the sampling time is less than 1/2B, where B is the predetermined passband.

5. The method of claim 1 further comprising sampling the continuous time signal using a second plurality of discrete sample pulses having a pulse shape in a time domain that is an impulse response of a filter having the predetermined passband.

6. The method of claim 5 wherein the second plurality of discrete sample pulses having the pulse shape in the time domain comprise a duration that exceeds 1/2B, where B comprises the predetermined passband.

7. The method of claim 5 further comprising providing a second plurality of discrete time samples of the continuous-time signal to a second output.

8. The method of claim 7 wherein the provided plurality of discrete time samples at the output and the provided second plurality of discrete time samples at the second output are offset by a sampling time.

9. The method of claim 1 further comprising performing analog-to-digital conversion that quantizes the discrete time samples of the continuous-time signal thereby providing a quantized sampled continuous-time signal.

10. The method of claim 1 further comprising providing a second continuous-time signal comprising a frequency spectrum that falls outside of the predetermined passband.

11. The method of claim 1 wherein the continuous-time signal comprises a wireless signal.

12. The method of claim 1 wherein the continuous-time signal comprises audio information.

13. The method of claim 1 wherein the continuous-time signal comprises video information.

14. The method of claim 1 wherein the continuous-time signal comprises imaging information.

15. The method of claim 1 wherein the predetermined passband comprises a fixed passband.

16. The method of claim 1 wherein the predetermined passband comprises a tunable passband.

17. The method of claim 1 wherein the filter comprises a Gaussian-shape filter.

18. The method of claim 1 wherein the filter comprises a raised-cosine-shape filter.

19. The method of claim 1 wherein the continuous-time signal is applied to the electrical input port of an electro-optic modulator and the discrete sample pulses are applied to the optical input port of the electro-optic modulator.

20. The method of claim 1 further comprising generating the plurality of discrete time samples of the continuous-time signal by performing a time domain convolution of a first signal that is the continuous-time signal and a second signal that is the plurality of discrete sample pulses having the pulse shape in the time domain that is the impulse response of the filter having the predetermined passband.

21. An extended-pulse sampling system comprising a sampler having an input configured to receive a continuous-time signal comprising a frequency spectrum within a predetermined passband, the sampler sampling the continuous time signal with a plurality of discrete sample pulses having a pulse shape in a time domain that is an impulse response of a filter having the predetermined passband, thereby generating a plurality of discrete time samples of the continuous-time signal at an output.

22. The system of claim 21 wherein the sampler samples the continuous signal with a plurality of discrete sample pulses that are uniformly spaced by a sampling time.

23. The system of claim 21 wherein the sampling time is a Nyquist sampling time.

24. The system of claim 21 wherein the sampling time is less than 1/2B, where B is the predetermined passband.

25. The system of claim 21 wherein the sampler is further configured to sample the continuous time signal using a second plurality of discrete sample pulses having a pulse shape in a time domain that is an impulse response of a filter having the predetermined passband.

26. The system of claim 25 further comprising a second output that provides a second plurality of discrete time samples of the continuous-time signal.

27. The system of claim 26 wherein the sampler is further configured so that the plurality of discrete time samples at the output and the provided second plurality of discrete time samples at the second output are offset by a sampling time.

28. The system of claim 25 wherein the sampler is further configured so that the second plurality of discrete sample pulses having the pulse shape in the time domain has a duration that exceeds 1/2B, where B comprises the predetermined passband.

29. The system of claim 21 further comprising a quantizer configured to perform analog-to-digital conversion that quantizes the discrete time samples of the continuous-time signal, thereby providing a quantized sampled continuous-time signal.

30. The system of claim 21 wherein the sampler is further configured to receive a second continuous-time signal comprising a frequency spectrum that falls outside of the predetermined passband.

31. The system of claim 21 wherein the sampler is further configured to receive a continuous-time signal comprises a wireless signal.

32. The system of claim 21 wherein the sampler is further configured to receive a continuous-time signal that comprises audio information.

33. The system of claim 21 wherein the sampler is further configured to receive a continuous-time signal that comprises video information.

34. The system of claim 21 wherein the sampler is further configured to receive a continuous-time signal that comprises imaging information.

35. The system of claim 21 wherein the predetermined passband comprises a fixed passband.

36. The system of claim 21 wherein the predetermined passband comprises a tunable passband.

37. The system of claim 21 wherein the filter comprises a Gaussian-shape filter.

38. The system of claim 21 wherein the filter comprises a raised-cosine-shape filter.

39. The system of claim 21 wherein the filter is realized by applying a continuous-time signal to the electrical input port of an electro-optic modulator and by applying the discrete sample pulses to the optical input port of this modulator.

40. The system of claim 21 further comprising a system that generates the plurality of discrete time samples of the continuous-time signal by performing a time domain convolution of a first signal that is the continuous-time signal and a second signal that is the plurality of discrete sample pulses having the pulse shape in the time domain that is the impulse response of the filter having the predetermined passband.

41. An extended-pulse sampling system comprising:
   a) an input configured to receive a continuous-time signal comprising a frequency spectrum within a predetermined passband;
   b) a splitter having an input electrically coupled to the input and configured to provide a first portion of the received continuous-time signal to a first output and to provide a second portion of the received continuous-time signal to a second output;
   c) a first sampler electrically coupled to the first output of the splitter that samples the first portion of the continuous time signal at a first time with a plurality of discrete sample pulses with a pulse shape in a time domain that is an impulse response of a filter having the predetermined passband and that provides the sampled first portion of the continuous time signal to an output;
   d) a second sampler electrically coupled to the second output of the splitter that samples the continuous time signal with at a second time with a plurality of discrete sample pulses having the pulse shape in the time domain that is the impulse response of the filter having the predetermined passband and that provides the sampled second portion of the continuous time signal at to output; and
   e) a switch having an input configured to connect to the output of the first sampler at the first time and to connect to the output of the second sampler at the second time, thereby providing a discrete time sample of the continuous-time sample at an output.

* * * * *